United States Patent
Itou et al.

(10) Patent No.: US 8,642,447 B2
(45) Date of Patent: Feb. 4, 2014

(54) SEMICONDUCTOR WAFER AND MANUFACTURING METHOD OF SEMICONDUCTOR DEVICE

(75) Inventors: Hironori Itou, Niiza (JP); Akio Iwabuchi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 280 days.

(21) Appl. No.: 13/023,861

(22) Filed: Feb. 9, 2011

(65) Prior Publication Data

US 2011/0204488 A1 Aug. 25, 2011

(30) Foreign Application Priority Data

Feb. 22, 2010 (JP) .................................. 2010-035502
Jul. 8, 2010 (JP) .................................. 2010-155572

(51) Int. Cl.
*H01L 21/00* (2006.01)

(52) U.S. Cl.
USPC ............... 438/462; 438/33; 438/68; 438/460; 257/618; 257/620; 257/E21.599

(58) Field of Classification Search
None
See application file for complete search history.

(56) References Cited

U.S. PATENT DOCUMENTS

2006/0006493 A1* 1/2006 Kawano et al. ............... 257/510
2009/0224409 A1* 9/2009 Miyata et al. ................. 257/774
2009/0278236 A1* 11/2009 Sato et al. ..................... 257/620

FOREIGN PATENT DOCUMENTS

JP 2009-272492 11/2009

* cited by examiner

*Primary Examiner* — Julio J Maldonado
*Assistant Examiner* — Joseph Galvin, III
(74) *Attorney, Agent, or Firm* — Oblon, Spivak, McClelland, Maier & Neustadt, L.L.P.

(57) ABSTRACT

A method of manufacturing a semiconductor device includes preparing a semiconductor wafer including a silicon substrate and a laminate having a compound semiconductor layer; etching and removing a part of the laminate in a thickness direction to form trench regions in a grid, each trench region including a plurality of stripe grooves extending in parallel to each other; filling the groove with a material having a lower hardness than the compound semiconductor layer to form a buried region; and dividing the semiconductor wafer into a plurality of chips by dicing using a blade at a dicing line which is defined within the trench region and includes a plurality of the buried regions.

9 Claims, 11 Drawing Sheets

SEMICONDUCTOR WAFER AND MANUFACTURING METHOD OF SEMICONDUCTOR DEVICE

CROSS REFERENCE TO RELATED APPLICATIONS AND INCORPORATION BY REFERENCE

This application is based upon and claims the benefit of priority from prior Japanese Patent Application P2010-035502 filed on Feb. 22, 2010 and prior Japanese Patent Application P2010-155572 filed on Jul. 8, 2010; the entire contents of which are incorporated by reference herein.

BACKGROUND OF THE INVENTION

1. Field of the Invention

The present invention relates to a semiconductor wafer including a compound semiconductor layer and a method of manufacturing a semiconductor device.

2. Description of the Related Art

Generally, semiconductor devices are manufactured by forming a plurality of semiconductor devices in a semiconductor wafer and dividing the semiconductor wafer into a plurality of chips for each semiconductor device. If there is a comparatively hard layer remaining in dicing lines at which the semiconductor wafer is to be cut, the blade cutting the semiconductor wafer can be badly damaged. For example, if a semiconductor wafer including a compound semiconductor layer, such as a gallium nitride (GaN) layer, formed on a silicon (Si) substrate is cut by a blade, the blade is more damaged than in the case where a Si wafer is cut. Moreover, vibration caused during dicing due to the damage of the blade will cause cracks or damages in semiconductor devices, resulting in a low yield. On the other hand, for the purpose of preventing the damages of the blade or preventing the low yield, it is possible to use a blade made of a special material or structure or employ a special dicing method. However, this will increase the manufacturing cost.

Accordingly, in one of the proposed methods, in order to prevent cracks from occurring in semiconductor wafers at dicing, grooves are formed on the both ends of each dicing line.

The aforementioned method could reduce the damages on semiconductor devices due to cracks or the like, but the blade will get damaged badly when cutting the hard compound semiconductor layer remaining in the dicing lines, in addition, the yield at dividing semiconductor wafers reduces.

SUMMARY OF THE INVENTION

An aspect of the present invention is a method of manufacturing a semiconductor device. The method comprises preparing a semiconductor wafer including a silicon substrate and a laminate having a compound semiconductor layer with a higher hardness than that of the silicon substrate; etching and removing a part of the laminate in a thickness direction until the silicon substrate is exposed to form trench regions in a grid, each trench region including a plurality of stripe grooves extending in parallel to each other; filling the inside of the groove with a material having a lower hardness than the compound semiconductor layer to form a buried region; forming semiconductor devices in element arrangement regions of the laminate each surrounded by the trench regions; and dividing the semiconductor wafer into a plurality of chips for each semiconductor device by dicing using a blade at a dicing line which is defined within the trench region and includes a plurality of the buried regions.

Another aspect of the present invention is a semiconductor wafer. The semiconductor wafer comprises a silicon substrate; and a laminate which is provided on the silicon substrate and includes a compound semiconductor layer having a higher hardness than that of the silicon substrate, the laminate including trench regions forming a grid, each of the trench regions including a plurality of stripe buried regions extending in parallel to each other and having a bottom in contact with the silicon substrate.

DETAILED DESCRIPTION OF THE INVENTION

Figure 1:
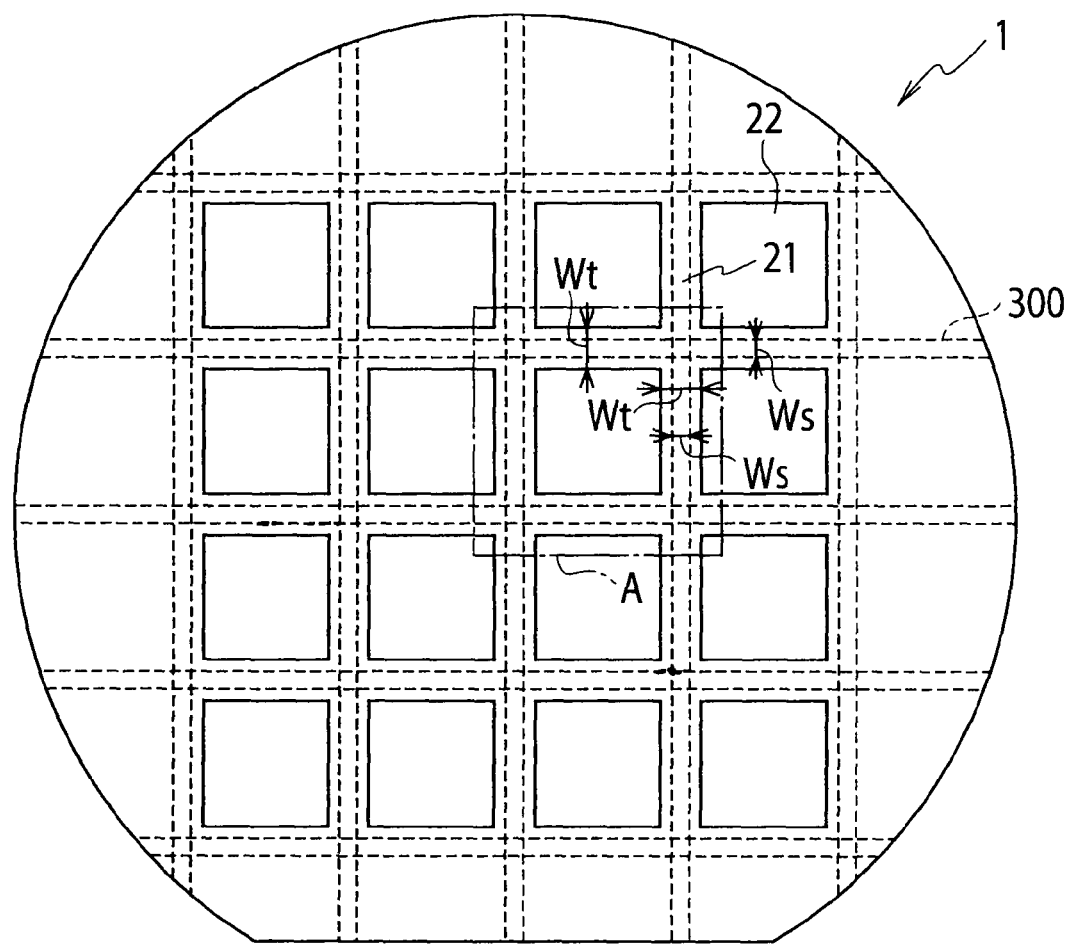
FIG. 1 is a top view showing a structure of a semiconductor wafer according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
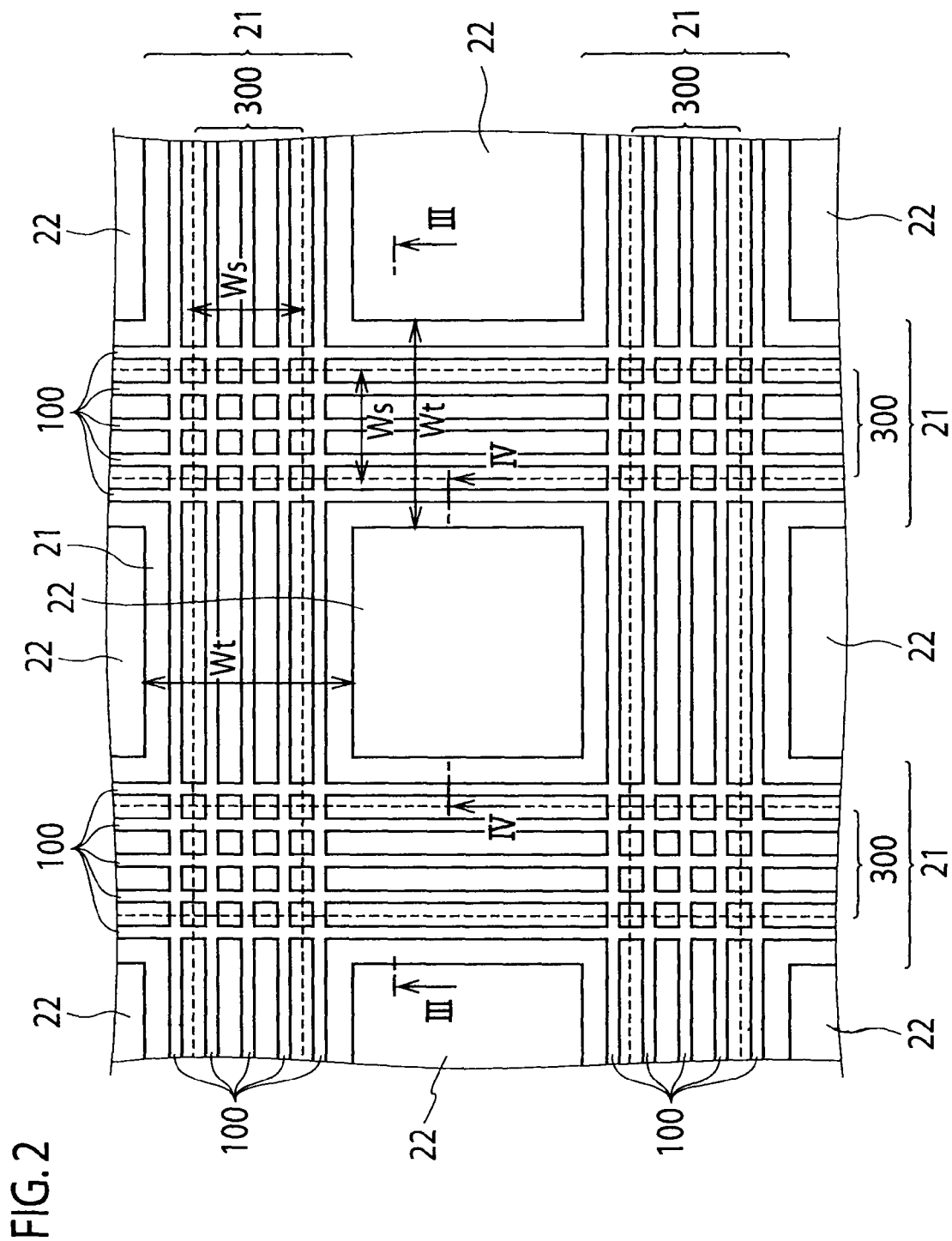
FIG. 2 is an enlarged view of a region A of FIG. 1.
Figure 3:
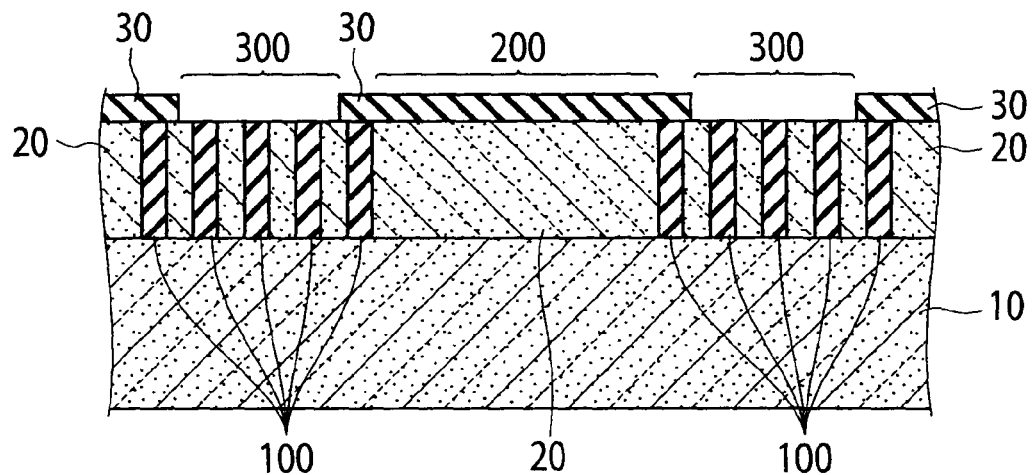
FIG. 3 is a cross-sectional view taken along a direction III-III of FIG. 2.

FIG. 1 shows a top view of a semiconductor wafer 1 according to a first embodiment of the present invention. FIG. 2 is an enlarged view of a region A indicated by a dashed-dotted line shown in FIG. 1. FIG. 3 is a cross-sectional view of the semiconductor wafer 1.

As shown in FIG. 3, the semiconductor wafer 1 includes a silicon substrate 10 and a laminate 20 provided on the silicon substrate 10. The laminate 20 includes compound semiconductor layers having higher hardness than that of the silicon substrate 10. A protective film 30 shown in FIG. 3 is configured to mechanically and electrically protect semiconductor devices 22 from the outside.

In the laminate 20, trench regions 21 including a plurality of stripe buried regions 100 form a grid. The buried regions 100 extend in parallel to each other, and the bottoms thereof are in contact with the silicon substrate 10. As described later, the buried regions 100 are formed by filling grooves formed in the surface of the laminate 20 with an insulator. The compound semiconductor layers having higher hardness than that of the silicon substrate 10 are a nitride semiconductor layer such as a nitride gallium (GaN) layer and an aluminum nitride (AlN) layer and the like, for example.

In regions each surrounded by the trench regions 21 (hereinafter, referred to as an element arrangement region 200), the semiconductor devices 22 are individually formed. The trench regions 21 shown in FIG. 1 farm a grid, and the semiconductor devices 22 are formed in individual sections of the grid. In other words, the plurality of semiconductor devices 22 are arranged in the semiconductor wafer 1 in an array of rows and columns.

The semiconductor wafer 1 is cut at dicing lines 300 defined within the trench regions 21 to be divided into a plurality of chips for each semiconductor device 22. Width Ws of each dicing line 300 is determined by width of a blade used to cut the semiconductor wafer 1. FIG. 2 shows an example in which five of the buried regions 100 are arranged side by side with each other in each trench region 21, but the number of buried regions 100 in each trench region 21 is not limited to five. The number of buried regions 100 is determined depending on width Wt of each trench region 21, width of each buried region 100, and distance between the adjacent ones of the buried regions 100. The width and distance of the buried regions 100 are described later.

Figure 4:
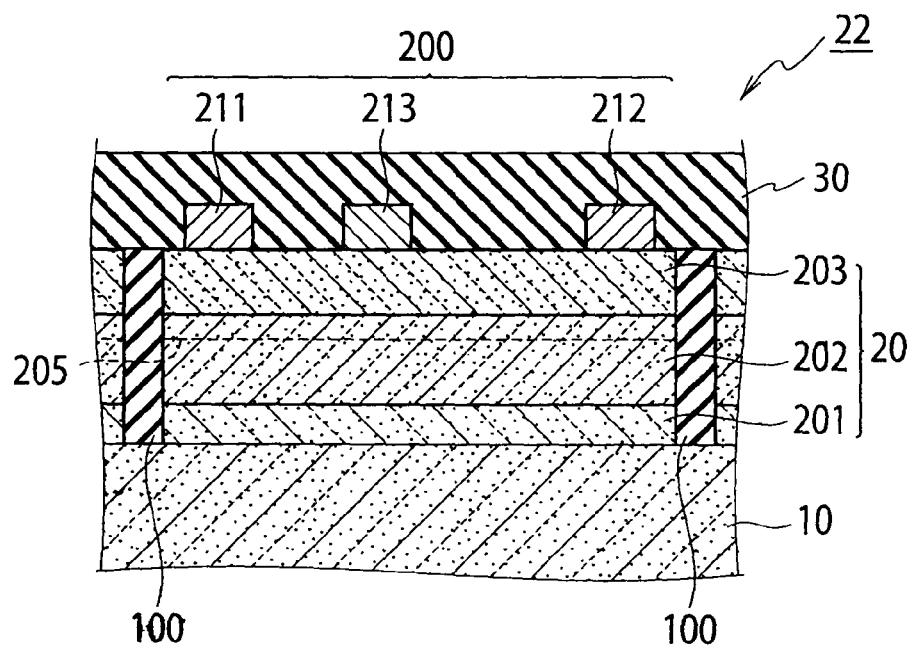
FIG. 4 is a schematic cross-sectional view showing a structure of a semiconductor device according to the first embodiment of the present invention.

FIG. 4 shows an example of the semiconductor devices 22 obtained by dividing the semiconductor wafer 1 into chips. FIG. 4 is a cross-sectional view taken along a direction IV-IV of FIG. 2. The semiconductor device 22 includes a part of the laminate 20 which is provided on the silicon substrate 10 and includes compound semiconductor layers having hardness higher than that of the silicon substrate 10. The part of the laminate 20 in the semiconductor device 22 includes some of the stripe buried regions 100 and one of the element arrangement regions 200 surrounded by the buried regions 100. The buried regions 100 extend along the outer periphery of the semiconductor device 22, and the bottoms of the buried regions 100 are in contact with the silicon substrate 10. In the element arrangement region 200, a semiconductor device such as a transistor, a diode, or a two-way switch is formed, for example.

FIG. 4 exemplifies the case where the semiconductor devices 22 are high electron mobility transistors (HEMT). The laminate 20 has a structure including a buffer layer 201, a carrier travel layer 202, and a carrier supply layer 203 laid on each other as the compound semiconductor layers having higher hardness than that of the silicon substrate 10. In the carrier travel layer 202, a two-dimensional carrier gas layer 205 as a current passage (channel) is formed near the heterojunction interface between the carrier travel layer 202 and the carrier supply layer 203.

The buffer layer 201 is formed by epitaxial growth at a known metal organic chemical vapor deposition (MOCVD) process or the like. The buffer layer 201 may be a multilayer structure buffer including a first sublayer made of AlN and a second sublayer made of GaN alternately laid on each other, for example. The buffer layer 201 does not directly concern the operation of the HEMT and can be omitted. The material of the buffer layer 201 may be a nitride semiconductor other than AlN and GaN or a group III-V compound semiconductor.

The carrier travel layer 202 provided on the buffer layer 201 is formed by epitaxially growing non-doped GaN with no impurities added, for example, to a thickness of about 0.3 to 10 μm by a MOCVD process or the like. Herein, the term "non-doped" means that impurities are not intentionally added.

The carrier supply layer 203 provided on the carrier travel layer 202 is made of a nitride semiconductor having a band gap larger than that of the carrier travel layer 202 and having a lattice constant different from the carrier travel layer 202. The carrier supply layer 203 is made of a nitride semiconductor expressed as, for example, $Al_xM_yGa_{1-x-y}N$ ($0<=x<1$, $0<=y<1$, $0<=x+y<=1$, M is indium (In), boron (B), or the like) or another compound semiconductor. When the carrier supply layer 203 is made of $Al_xM_yGa_{1-x-y}N$, the composition ratio x is preferably 0.1 to 0.4 and more preferably 0.3. The carrier supply layer 203 can be also made of non-doped $Al_xGa_{1-x}N$. Moreover, the carrier supply layer 203 can be made of a nitride semiconductor composed of $Al_xGa_{1-x}N$ added with an n-type impurity.

The carrier supply layer 203 is formed on the carrier travel layer 202 by epitaxial growth at such as a MOCVD process or the like. Since the carrier supply and travel layers 203 and 202 have different lattice constants, lattice strain could cause piezoelectric polarization. Because of this piezoelectric polarization and voluntary polarization included in crystals of the carrier supply layer 203, carriers are generated at high density near the hetero-junction, thus forming the two-dimensional carrier gas layer 205. The thickness of the carrier supply layer 203 is smaller than that of the carrier travel layer 202, which is about 10 to 50 nm, for example, about 25 nm. On the carrier supply layer 203, a non-doped GaN layer as a cap layer may be provided.

On the carrier supply layer 203, a source electrode 211, a drain electrode 212, and a gate electrode 213 are provided. Moreover, on the carrier supply layer 203, a protective film 30 is provided so as to cover the source, drain, and gate electrodes 211, 212, and 213.

The source and drain electrodes 211 and 212 are made of metals each capable of forming a low resistance contact (an ohmic contact) with the laminate 20. For example, the source and drain electrodes 211 and 212 are formed as a laminate of titanium (Ti) and aluminum (Al) or the like. The source and drain electrodes 211 and 212 form ohmic contacts with the two-dimensional carrier gas layer 205. Alternatively, the source and drain electrodes 211 and 212 are provided on the carrier travel layer 202.

The gate electrode 213 is located between the source and drain electrodes 211 and 212. The two-dimensional carrier gas layer 205 serves as a current passage (channel) between the source and drain electrodes 211 and 212, and the current flowing the channel is controlled by gate control voltage applied to the gate electrode 213. The gate electrode 213 is composed of a laminate structure of nickel (Ni) and gold (Au) films, for example.

The protective film 30 can be made of a several micrometers thick silicon oxide ($SiO_2$) or silicon nitride (SiN) film or a laminated structure of these films. For example, the protective film 30 is made of a laminate of an about 5 μm thick $SiO_2$ film and an about 3 μm thick SiN or polyimide (PI) film.

Hereinafter, with reference to FIGS. 5 to 12, a description will be given of a method of manufacturing a semiconductor device according to the first embodiment of the present invention. Specifically, the description is given of a manufacturing method of a semiconductor device which divides the semiconductor wafer 1 into a plurality of chips, the semiconductor wafer 1 including the silicon substrate 10 and the laminate 20 having a compound semiconductor layer having a higher hardness than that of the silicon substrate 10. The method of manufacturing a semiconductor device described below is just an example, and the embodiment of present invention can be also implemented by various manufacturing methods other than this including modifications thereof. The description below exemplifies the case of manufacturing the HEMT shown in FIG. 4 as an example. FIGS. 5 to 12 are cross-sectional views along a direction III-III of FIG. 2.

Figure 5:
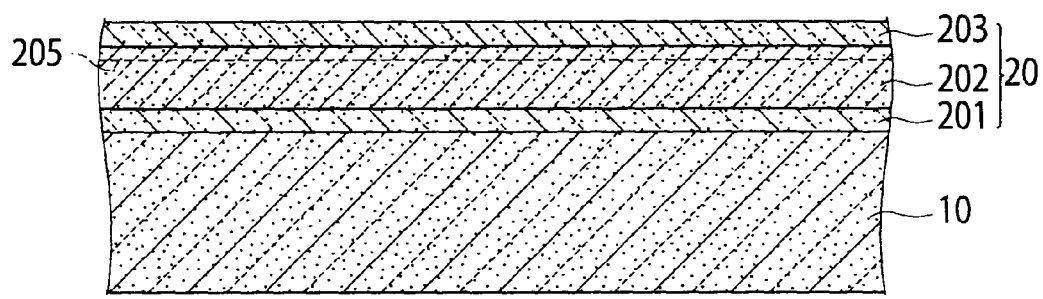
FIGS. 5 to 12 are cross-sectional process views illustrating a method of manufacturing a semiconductor device according to the first embodiment of the present invention.

First, as shown in FIG. 5, the laminate 20 is formed on the silicon substrate 10. For example, on the silicon substrate 10, the buffer layer 201 with a thickness of about 2 µm, the carrier travel layer 202 with a thickness of about 3.2 µm, and the carrier supply layer 203 with a thickness of 25 nm are epitaxially grown in this order. The buffer layer 201 has a structure including AlN and GaN layers alternately laid on each other, for example. The carrier travel layer 202 is composed of a non-doped GaN film, for example. The carrier supply layer 203 is made of a nitride semiconductor having a band gap larger than that of the carrier travel layer 202 and having a lattice constant different from that of the carrier travel layer 202. For example, the carrier supply layer 203 is composed of a non-doped AlGaN film. The buffer, carrier travel, and carrier supply layers 201, 202, and 203 are compound semiconductor layers harder than the silicon substrate 10.

Next, the trench regions 21 each including a plurality of stripe grooves extending in parallel to each other are formed by partially etching the laminate 20 in the thickness direction so as to expose the silicon substrate 10.

Figure 6:
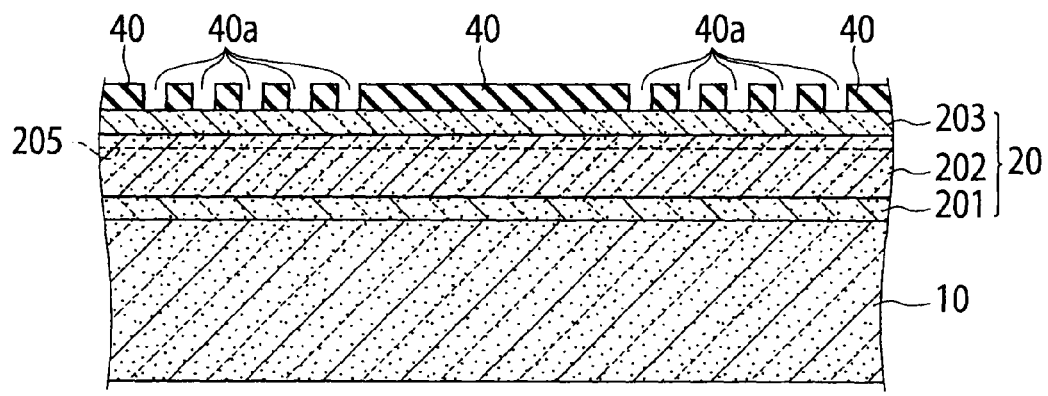

For example, as shown in FIG. 6, as a hard mask used for etching the laminate 20, a mask oxide film 40 is formed on the carrier supply layer 203. Specifically, the mask oxide film 40 is formed on the entire surface of the laminate 20 by a MOCVD process or the like. At positions where the buried regions 100 are to be formed, openings 40a of the mask oxide film 40 are formed by photolithography and etching. For example, a photoresist film (not shown) having a pattern for forming the openings 40a is provided on the mask oxide film 40. Using this photoresist film as a mask, the mask oxide film 40 is selectively removed by anisotropic etching such as reactive ion etching (RIE) with fluorine (F) contained gas to form the openings 40a.

Figure 7:
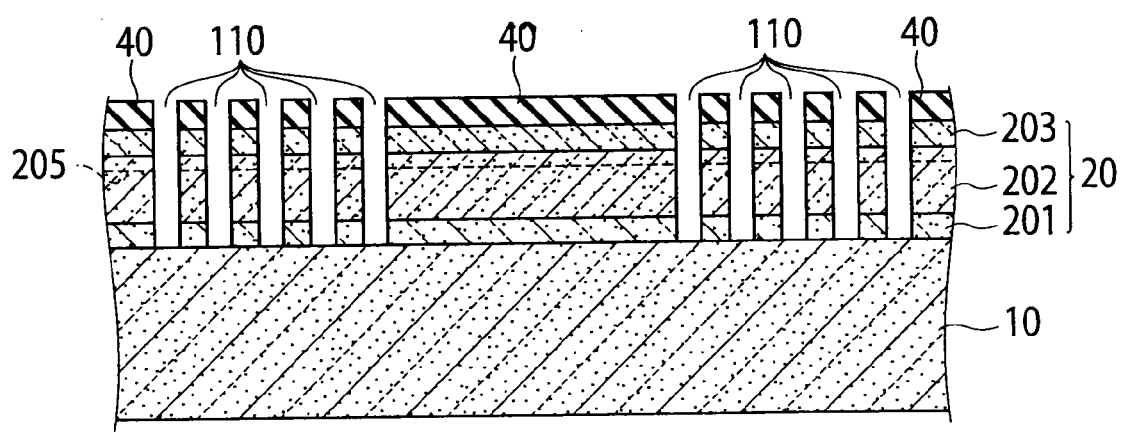

As shown in FIG. 7, using the mask oxide film 40 including the openings 40a as a hard mask, grooves 110 are formed by dry-etching the laminate 20 in the thickness direction at the positions where the buried regions 100 of the trench regions 21 are to be formed. The etching of the laminate is performed until at least the surface of the silicon substrate 10 is exposed. For example, the carrier supply, carrier travel, and buffer layers 203, 202, and 201 are etched by anisotropic etching using chlorine (Cl) contained gas. In order to surely prevent the laminate 20 from partially remaining on the bottom of each groove 110, the silicon substrate 10 may be subjected to over-etching to be partially etched in upper part thereof. The formation of the grooves 110 can be performed by an inductively coupled plasma process (ICP) or the like.

Width w of the grooves 110 is about 1 to 5 µm, and distance d between the grooves 110 adjacent to each other (hereinafter, referred to as "groove distance") is about 1 to 5 µm. The number of the grooves 110 arranged in each trench region 21 is determined by the width Wt of the trench regions 21. The width Wt of the trench regions 21 is set wider than the width of the blade cutting the semiconductor wafer 1. To be specific, the width Wt of each trench region 21 is set so that at least one of the grooves 110 remains on each side of each dicing line 300 cut by the blade.

As described above, the trench regions 21 including the plurality of stripe grooves 110 extending in parallel to each other are thus formed.

Figure 8:
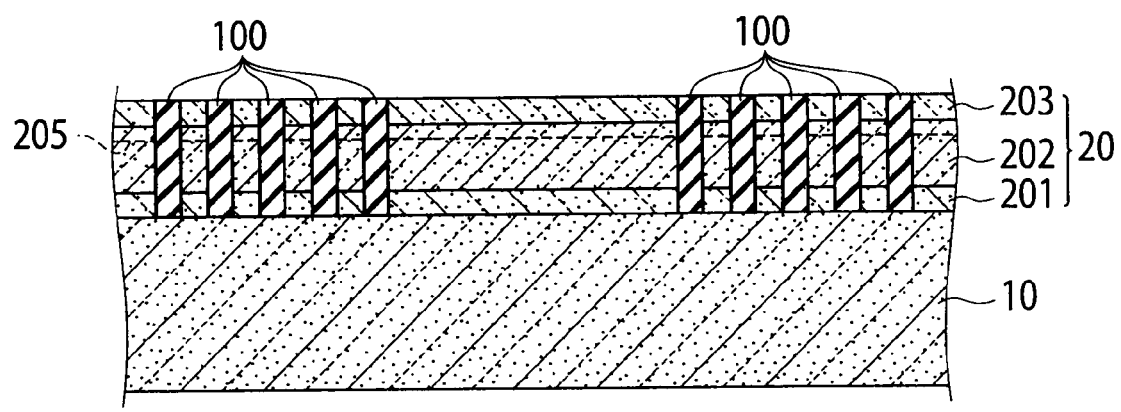

Subsequently, as shown in FIG. 8, the buried regions 100 are formed by filling the grooves 110 with a material having a lower hardness than the buffer, carrier travel, and carrier supply layers 201, 202, and 203. For example, after the mask oxide film 40 is removed, SOG (spin on glass) is applied onto the laminate 20. The SOG is heated at about 600° C. to form an $SiO_2$ film within each groove 110. Thereafter, the upper surfaces of the buried regions 100 are flattened by a chemical mechanical polishing (CMP) process so as to be located in a same plane level as the upper surface of the laminate 20. Herein, the $SiO_2$ film may be flattened by etch back of a known wet etching process.

Next, the semiconductor device 22 in each element arrangement region 200 of the laminate 20 surrounded by the trench regions 21a is formed by a microfabrication process.

Figure 9:
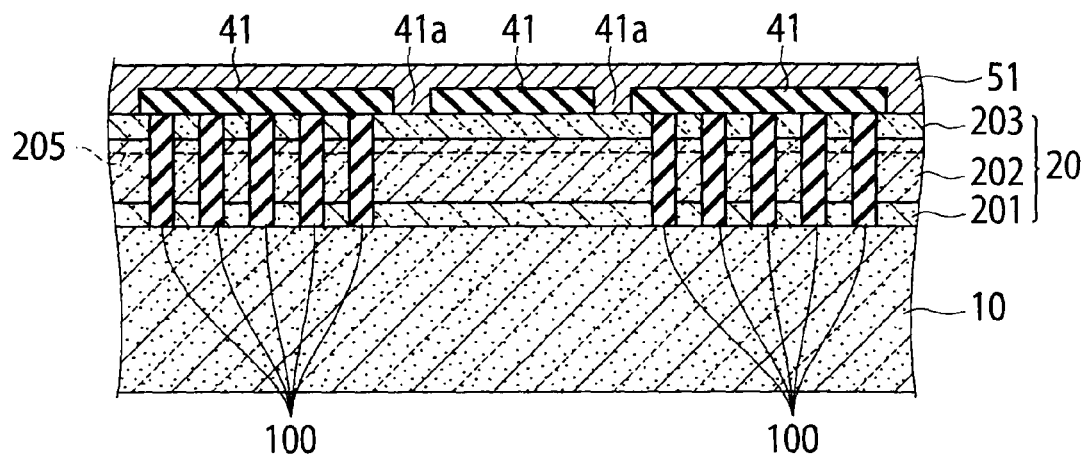

As shown in FIG. 9, for example, an oxide film 41 and a metal film 51 are sequentially laid on the entire surface of the semiconductor wafer 1. The metal film 51 is in contact with the laminate 20 through openings 41a of the oxide film 41. The oxide film 41 is formed by an MOCVD process, for example. In a similar way to the method of forming the openings 40a in the mask oxide film 40, the openings 41a of the oxide film 41 are formed by photolithography and etching at positions where the source and drain electrodes 211 and 212 are to be formed. Since the upper surfaces of the buried regions 100 and the upper surface of the laminate 20 are flattened to be located in a same plane level, the oxide film 41 and a not-shown photoresist film are formed uniformly. The fine openings 41a can be therefore easily formed. The metal film 51 is formed on the oxide film 41 by spattering Ti and Al targets. The oxide film 41 is removed by a lift-off process to form the source and drain electrodes 211 and 212 having a laminated structure of Ti and Au.

Figure 10:
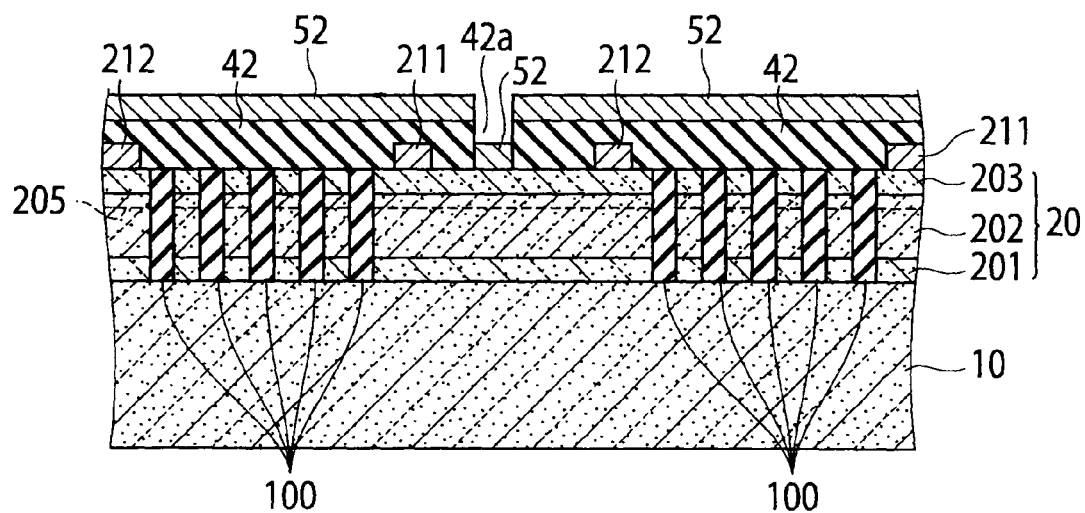

Next, as shown in FIG. 10, on the entire surface of the semiconductor wafer 1, an oxide film 42 and a metal film 52 are sequentially laminated. The metal film 52 is in contact with the laminate 20 through openings 42a of the oxide film 42. The oxide film 42 is formed by an MOCVD process, for example. Each opening 42a of the oxide film 42 is formed by photolithography and etching at the position where the gate electrode 213 is to be formed. Since the upper surfaces of the buried regions 100 and the upper surface of the laminate 20 are flattened to be in a same plane level, the oxide film 42 and a not-shown photoresist film are formed uniformly. The fine openings 42a can be therefore easily formed. The metal film 52 is formed on the oxide film 42 by spattering Ni and Au targets. The oxide film 42 is removed by a lift-off process to form the gate electrode 213 having a laminated structure of Ti and Au.

Figure 11:
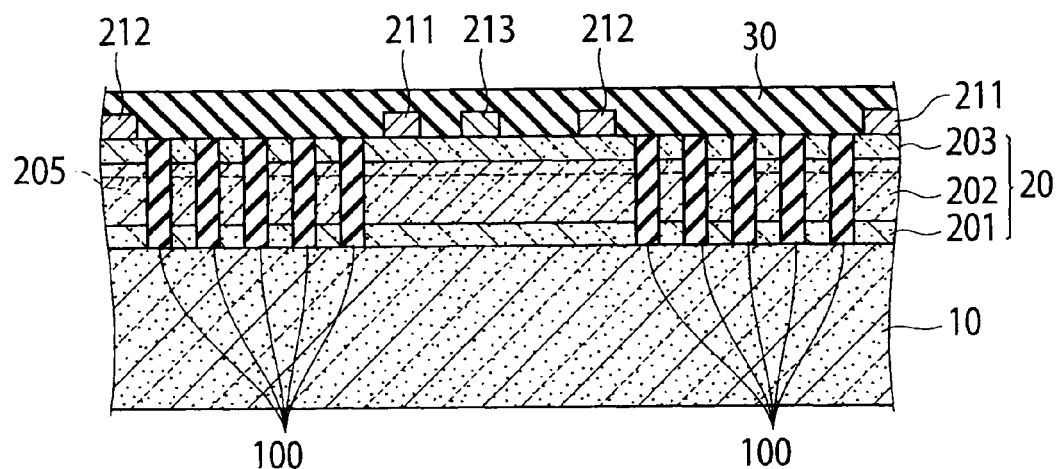

As shown in FIG. 11, on the entire surface of the semiconductor wafer 1, the protective film 30 is formed. The protective film 30 is a laminated film composed of an $SiO_2$ film and an SiN or PI film, for example.

By the aforementioned microfabrication process, the semiconductor devices 22 are individually formed in the element arrangement regions 200 each surrounded by the trench regions 21.

Figure 12:
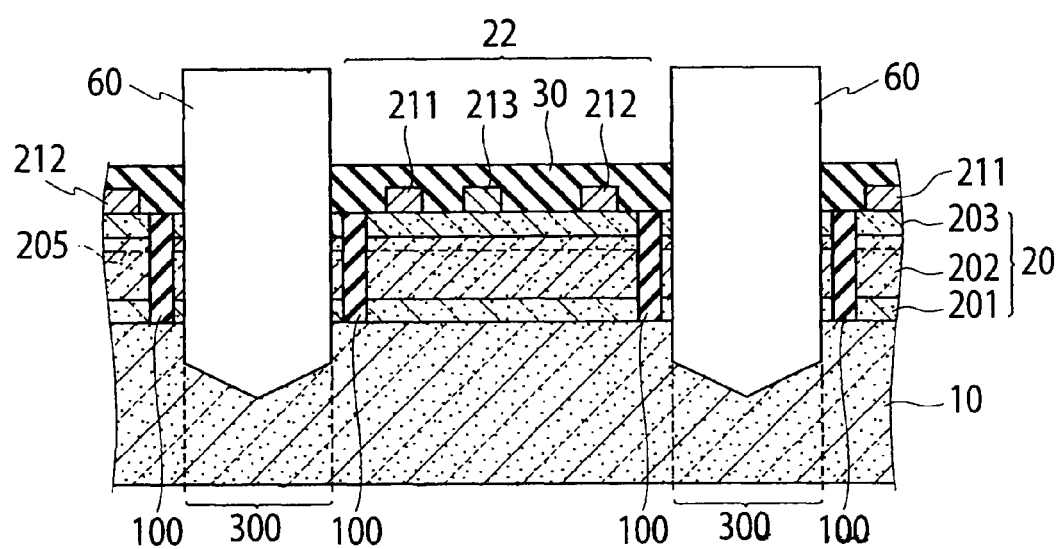

Next, as shown in FIG. 12, dicing is performed with blades 60 along the trench regions 21 at the dicing lines 300 which are individually defined within the trench regions 21 and each include the plurality of buried regions 100. The semiconductor wafer 1 is therefore divided into a plurality of chips for each semiconductor device 22.

For example, a part of the protective film 30 at each dicing line 300 is removed by photolithography and etching. The width Ws of each dicing line 300 is set narrower than the width Wt of each trench region 21 so that at least one of the buried regions 100 remains at each side of the dicing line 300. The semiconductor wafer 1 is cut by the blades 60 at the dicing lines 300 each including the plurality of buried regions 100. Since each of the buried regions 100 is made of a material with a lower hardness than those of the buffer, carrier travel, and carrier supply layers 201, 202, and 203, the blades 60 are less damaged than the case where the buried regions 100 are not formed in the dicing lines 300. The semiconductor device 22 shown in FIG. 4 is thus obtained.

The degree of damage of the blades 60 due to dicing is affected by the relation between the groove width w and groove distance d of each buried region 100 at each dicing line 300. The wider the groove width w and the narrower the groove distance d, which corresponds to the width of each region including the compound semiconductor layers, the less the blades 60 are damaged.

However, when the groove width w of the buried regions 100 is excessively large, the surfaces of the buried regions 100 formed by filling the grooves 110 cannot be flattened. If the surfaces of the buried regions 100 are not flat, the microfabrication process for formation of each electrode of the semiconductor device 22 and the like cannot be conducted at high accuracy. To flatten the surfaces of the buried regions 100, it is preferable that the groove width w is about 1 to 5 μm. If the groove width w is increased, the trench regions 21 are widened, and the number of effective chips in the semiconductor wafer 1 is reduced.

Moreover, the narrower the groove distance d between the adjacent buried regions 100, the blades 60 are less damaged. However, if the groove distance d is excessively small, there will be a process problem that laminated structures between the grooves 110 could be broken. Accordingly, the groove distance d needs to be about 1 to 5 μm and is preferably about 3 μm.

For example, the groove width w of the buried regions 100 is set to 2 μm, and the groove distance d between the adjacent buried regions 100 is set to 3 μm. At this time, the sum of the pair of the groove width w and distance d (hereinafter, referred to as a "groove period") is 5 μm, and the ratio of the groove distance d to the groove period is 60%. To reduce the damage of the blades 60, it is preferable that this ratio is not more than 60%. The groove distance d between the adjacent buried regions 100 does not need to be constant in each trench region 21.

As shown in FIG. 12, each dicing line 300 is defied within one of the trench regions 21 so that at least one of the buried regions 100 exist in each side of the dicing line 300. This can provide an effect that crack caused in each dicing line 300 during dicing will be prevented from reaching the semiconductor devices 22. In other words, by setting the width Wt of the trench regions 21 wider than width Ws of the dicing lines 300, the yield can be prevented from decreasing.

In the above-described example, each groove 110 is filled with an $SiO_2$ film. Each groove 110 may be filled with an insulating film other than the $SiO_2$ film or may be filled with a material having a lower hardness than the compound semiconductor layers included in the laminate 20 instead of the insulating film. For example, the grooves 110 may be filled with a polysilicon film after the insulating film such as $SiO_2$ film is formed on the bottom and side surfaces of each groove 110. Alternatively, the grooves 110 may be filled with metal or resin. If an insulating film is formed on the bottom and side surfaces of each groove 110, the grooves 110 can be filled with a material having a lower hardness than that of the insulating film. This can further reduce the damage of the blades 60.

If the semiconductor device 22 is covered with a thick insulating film because of having a multilayer interconnection structure or the like, it is difficult to form fine grooves reaching the silicon substrate 10 after the insulating film is formed. The grooves 110 cannot be therefore formed after the microfabrication process. On the other hand, for the microfabrication process, the photoresist film needs to be uniformly formed. Accordingly, the grooves 110 with the groove width w being wide cannot be formed before the microfabrication process.

According to the method of manufacturing a semiconductor device of the first embodiment, however, the trench regions 21 each including the plurality of narrow grooves 110 arranged are formed along the outer periphery of each semiconductor device 22 before the microfabrication process. Since the groove width w of the grooves 110 is small, the upper surfaces of the grooves 110 filled with the insulating film can be flat. The upper surfaces of the buried regions 100 and the upper surface of the laminate 20 are located in a same plane level. Accordingly, the microfabrication processes to form each electrode of the semiconductor devices 22 and the like can be executed.

Moreover, at least one of the buried regions 100 is formed on each side of each dicing line 300. Accordingly, cracks and damages caused by vibration due to dicing for dividing the semiconductor wafer 1 are less likely to reach the element arrangement regions 200 of the semiconductor devices 22, thus preventing the yield of the semiconductor devices 22 from decreasing.

Furthermore, in each of the dicing lines 300 to be cut by the blades 60, the area occupied by the compound semiconductor layers harder than the silicon substrate 10, such as the GaN and AlGaN films, is smaller than that in the case where the buried regions 100 are not included in dicing lines. Accordingly, when the semiconductor wafer 1 including the compound semiconductor layers is divided into a plurality of chips, the blades 60 are prevented from being broken, and the semiconductor devices 22 will be less damaged.

As described above, according to the method of manufacturing a semiconductor device of the first embodiment of the present invention, it is possible to prevent the blades 60 from being damaged and prevent the reduction in yield at dicing of the semiconductor wafer 1, thus achieving high reliability. Moreover, it is possible to apply a blade and a dicing method for silicon substrates, thus preventing an increase in cost.

<Modification>

Figure 13:
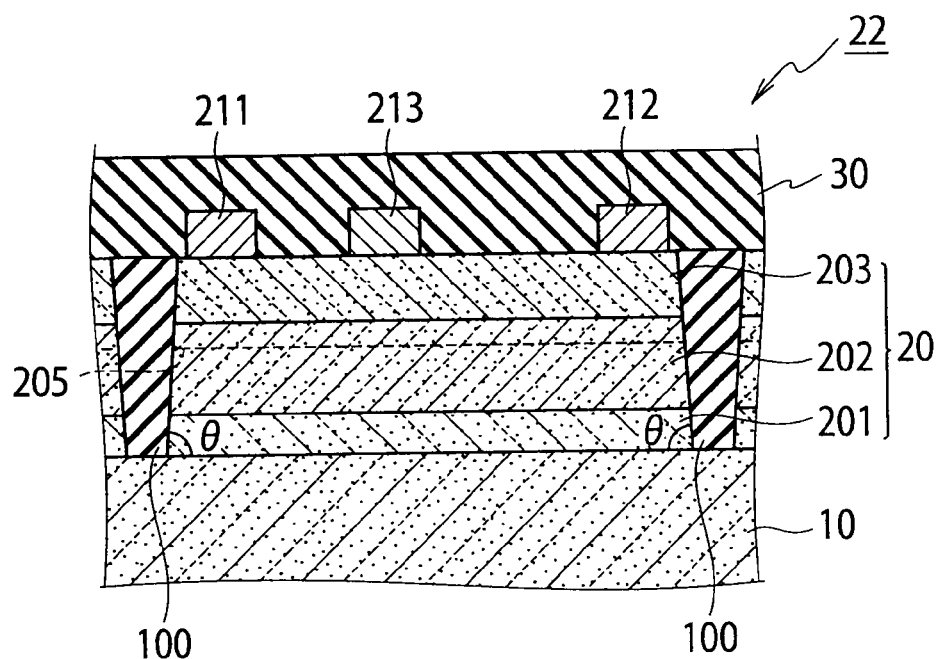
FIG. 13 is a cross-sectional view showing a structure of a semiconductor device according to a modification of the first embodiment of the present invention.

As shown in FIG. 13, in a semiconductor device 22 according to a modification of the first embodiment, each side surface of a part of the laminate 20 partitioned by the trench regions 21 is inclined at an angle θ not more than 90 degrees with respect to the bottom surface thereof. For example, the angle θ between the side and the bottom surfaces of the partitioned part of the laminate 20 is about 60 to 80 degrees.

To be specific, the shape of each buried region 100 in a section along a direction orthogonal to the direction that the buried region 100 extends is a forward tapered shape narrow at the bottom and wide at the top. Accordingly, in the step of forming the grooves 110, the process conditions are set so that the opening of each groove 110 is wider than the bottom surface.

At forming the grooves 110 having a rectangular cross sectional shape in the compound semiconductor layers including the AlN, AlGaN, and GaN films and the like using dry etching, the following process conditions can be employed, for example. The grooves 110 are formed by an ICP process with dichloromethane ($CH_2Cl_2$) and chlorine ($Cl_2$) gaseous species at a gas pressure of 1.56 Pa. However, the AlN film has a greater tendency to be isotropically etched than the GaN film having a smaller composition ratio of Al. Even when the grooves 110 are formed in the compound semiconductor layers by isotropic etching, therefore, the sectional shape of the grooves 110 is sometimes a barrel shape widest around the middle part instead of the rectangular shape, for example. These grooves 110 are filled to farm the barrel-shaped buried regions 100.

On the other hand, in order to farm the buried regions 100 of the forward tapered shape as shown in FIG. 13, the forward tapered grooves 110 narrow at the bottom and wide at the top are formed under the process conditions in which the mixed ratio of dichloromethane gaseous species of the ICP process is set higher than that in the case of farming the aforementioned barrel-shaped buried regions 100. Thereafter, the grooves 110 are filled with a material having a lower hardness than those of the compound semiconductor layers included in the laminate 20 to form the buried regions 100 shown in FIG. 13.

By forming the buried regions 100 tapered as described above, the carrier supply layer 203 is thin at the edge of each semiconductor device 22. Accordingly, lattice relaxation will occur at the edge of the carrier supply layer 203, and the carrier concentration due to the piezo-polarization of the two-dimensional carrier gas layer 205 is therefore reduced. This results in high resistance at the edge of the carrier travel layer 202, thus preventing leak current from occurring at the edge of each semiconductor device 22.

Second Embodiment

Figure 14:
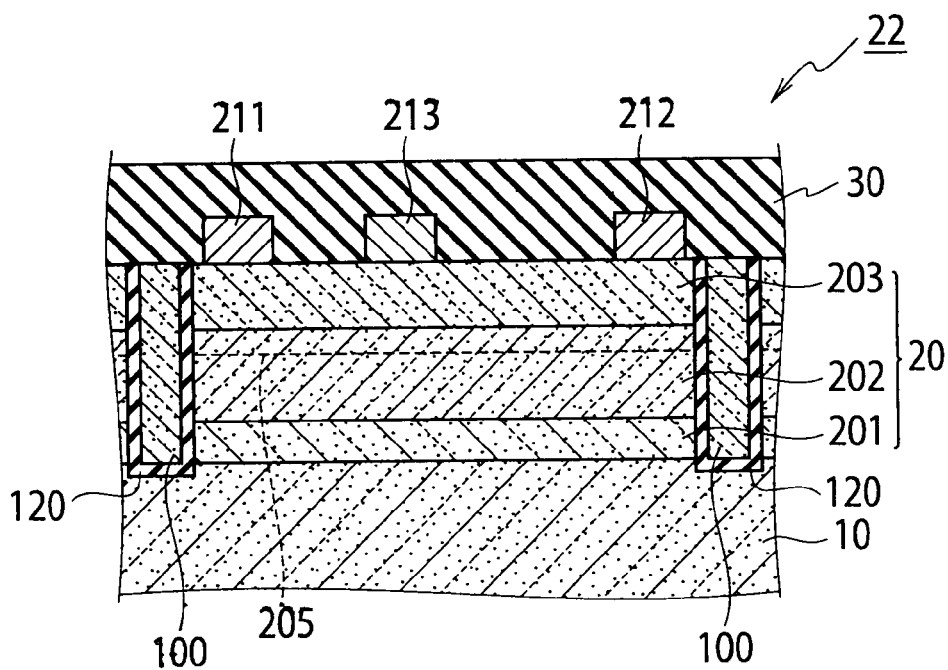
FIG. 14 is a cross-sectional view showing a structure of a semiconductor device according to a second embodiment of the present invention.

FIG. 14 shows a cross-sectional view showing a semiconductor device 22 according to a second embodiment of the present invention. The semiconductor device 22 shown in FIG. 14 is different from that shown in FIG. 4 in that a high resistance region 120 is provided on the side and bottom surfaces of each buried region 100. The high resistance region 120 has a resistance value equal to that of the insulating film. The inside of the high resistance region 120 is filled with a conductive material such as amorphous silicon, for example. An example of the method of manufacturing the semiconductor device shown in FIG. 14 is described below.

The plurality of grooves 110 are formed in each trench region 21 in a similar way to that explained with reference to FIGS. 5 to 7.

Figure 15:
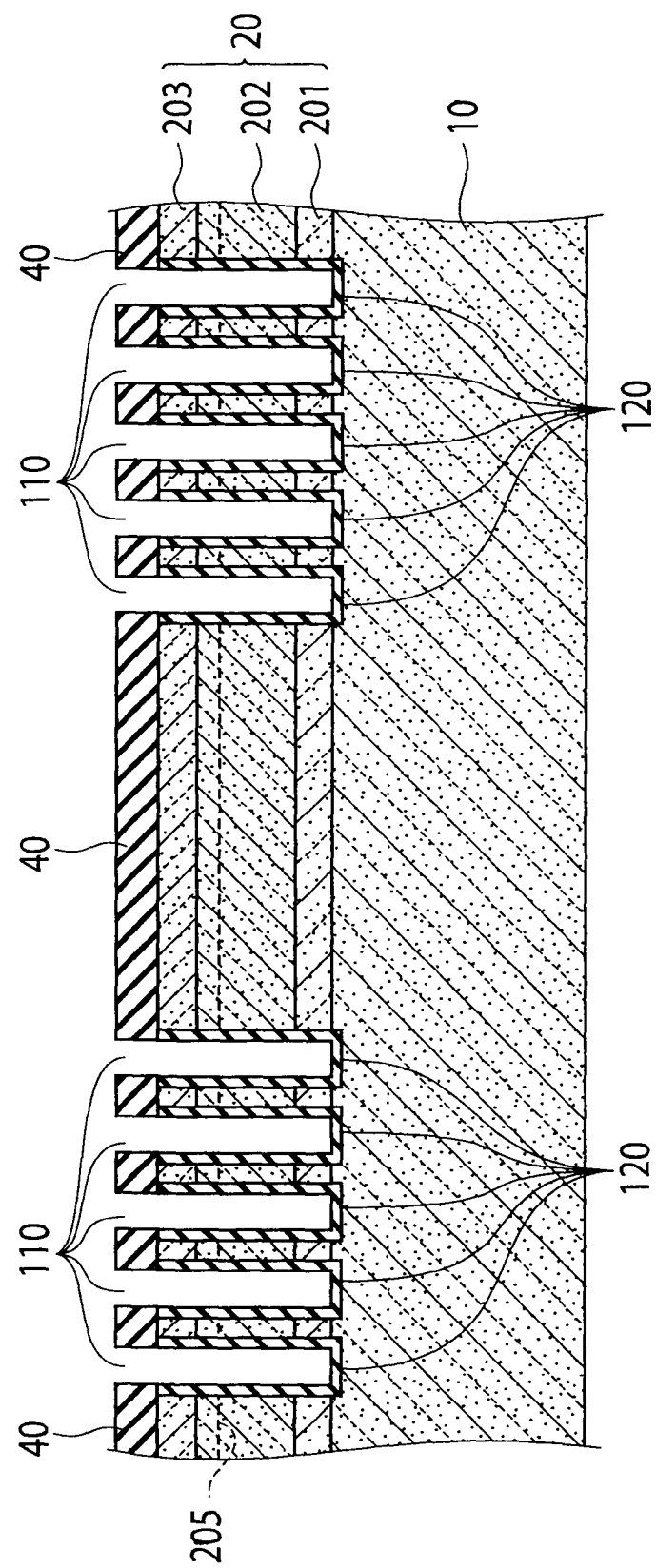
FIGS. 15 and 16 are cross-sectional process views illustrating a method of manufacturing a semiconductor device according to the second embodiment of the present invention.

Next, as shown in FIG. 15, the high resistance region 120 is formed on the side and bottom surfaces of each groove 110 by ion implantation using the mask oxide film 40 as a mask. For example, nitrogen (N) ions are implanted into part of the laminate 20 and silicon substrate 10 exposed in the side and bottom surfaces of each groove 110 under the conditions: the acceleration energy is 20 to 100 keV and the dose amount is $1\times10^{14}$ cm$^2$. The high resistance region 120 having a sheet resistance of about $10^8$ Ω/square is then formed. For forming the high resistance region 120, ion species such as iron (Fe), boron (B), and the like can be used in addition to nitrogen.

Figure 16:
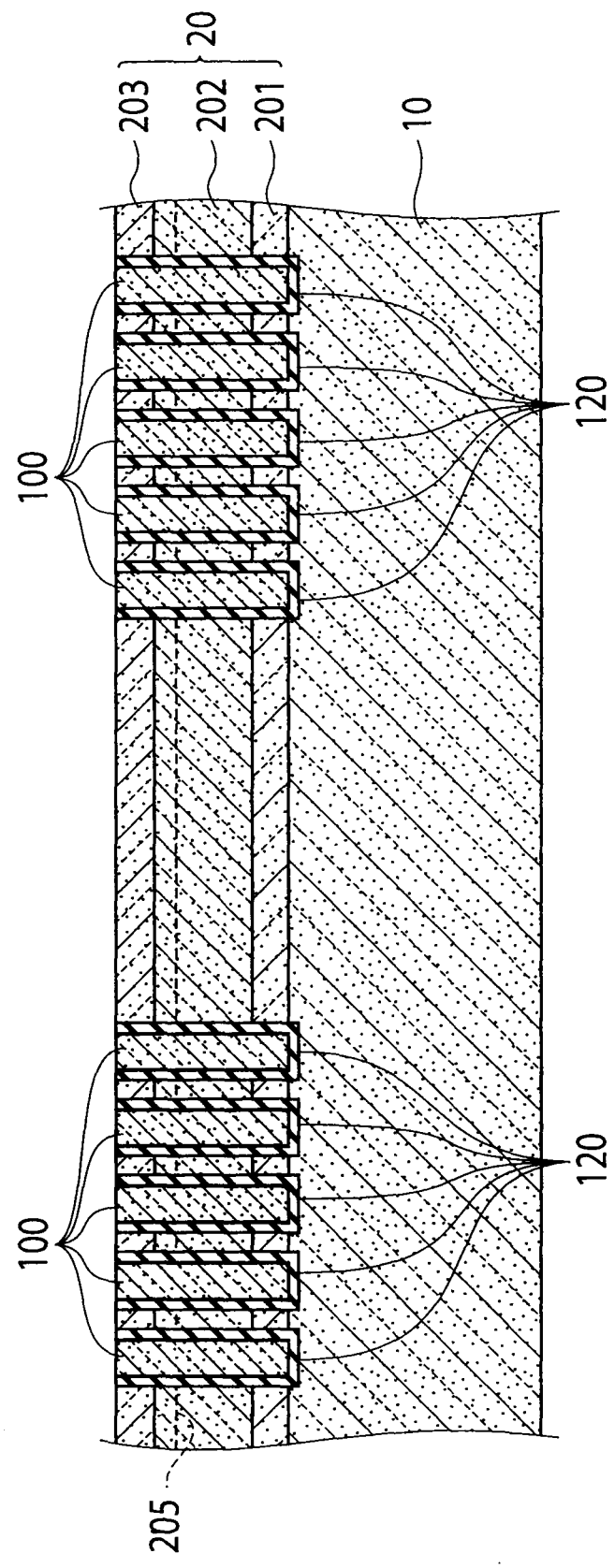

After the high resistance regions 120 are formed, the grooves 110 are filled with a material having a lower hardness than those of the buffer, carrier travel, and carrier supply layers 201, 202, and 203, thus forming the buried regions 100 as shown in FIG. 16. After the mask oxide film 40 is removed, a polysilicon film is formed within each groove 110, for example. The upper surface of the buried regions 100 and the upper surface of the laminate 20 are flattened by chemical mechanical polishing (CMP) or the like so as to be located in a same plane level.

Thereafter, in a similar way to that explained with reference to FIGS. 9 to 11, the semiconductor device 22 is formed in each element arrangement region 200 by a microfabrication process, and the protective film 30 is then formed on the entire surface of the semiconductor wafer 1. Since the upper surfaces of the buried regions 100 and the upper surface of the laminate 20 are located in a same plane level, it is possible to execute the microfabrication processes to form each electrode of the semiconductor devices 22 and the like.

Next, in a similar way to that explained with reference to FIG. 12, dicing is performed for the dicing lines 300 using the blades 60 to divide the semiconductor wafer 1 into a plurality of chips for each semiconductor device 22. The semiconductor device 22 shown in FIG. 14 is thus completed as described above.

The grooves 110 may be formed so as to have a tapered shape having an opening wider than the bottom surface. The tapered shape of the grooves 110 facilitates the ion implantation into the bottom and side surfaces of the grooves 110. Furthermore, as explained with reference to FIG. 13, it is possible to prevent the occurrence of leak current at the edge of the semiconductor device 22.

Since the high resistance regions 120 are formed on the side and bottom surfaces of the buried regions 100 by ion implantation as described above, the grooves 110 can be filled with a material having lower hardness than that of insulating film such as an SiO$_2$ film, for example, such as a polysilicon film, in a same way as that of forming the insulating film on the bottom and side surfaces of the grooves 110. In other words, the area occupied by the compound semiconductor layers harder than the silicon substrate at each dicing line 300 is smaller than that at a dicing line not including the buried regions 100.

According to the method of manufacturing the semiconductor device of the second embodiment, the damage of the blades 60 can be prevented, and the semiconductor device 22 is less damaged. The others are substantially the same as the first embodiment, and the redundant description thereof is omitted.

Third Embodiment

Figure 17:
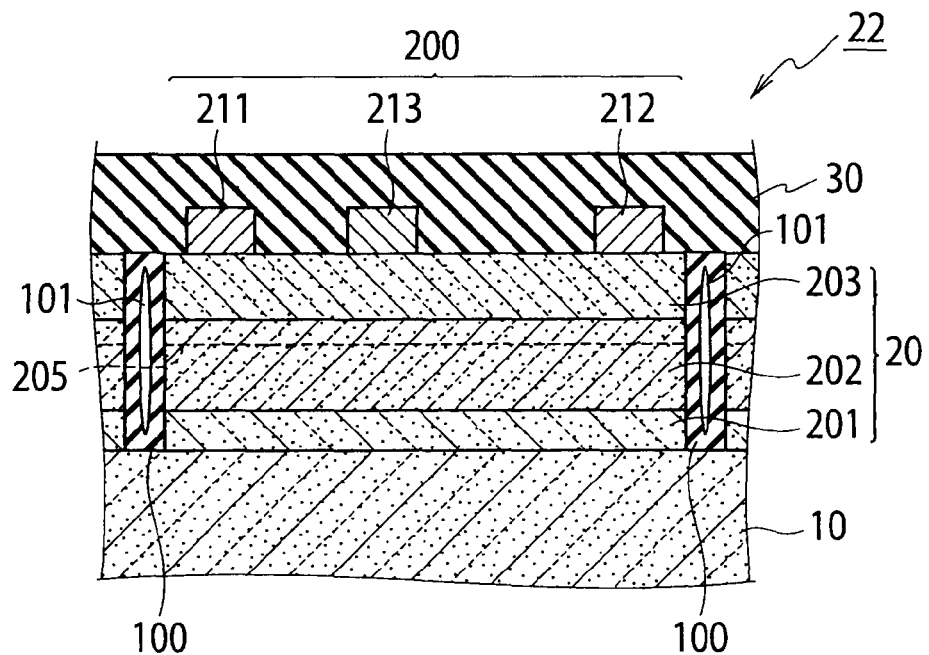
FIG. 17 is a cross-sectional view showing a structure of a semiconductor device according to a third embodiment of the present invention.

As shown in FIG. 17, a semiconductor device 22 according to a third embodiment of the present invention differs from the semiconductor device 22 shown in FIG. 4 in including a cavity 101 within each buried region 100. The cavity 101 can be formed within each buried region 100 by filling the grooves 110 so as to generate void, for example. An example of the method of manufacturing the semiconductor device 22 shown in FIG. 17 is described below.

In a similar way to that explained with reference to FIGS. 5 to 7, the plurality of grooves 110 are formed in each trench region 21. For example, the grooves 110 are formed by an ICP process using the mask oxide film 40 composed of a 2 μm thick SiO$_2$ film as a hard mask.

Next, the grooves 110 are filled with a material having a lower hardness than those of the compound semiconductor layers included in the laminate 20. At this time, void is generated in each groove 110 by filling the grooves 110 with an about 1 μm PE-TEOS film (SiO$_2$ film) under the process conditions; the film formation temperature is 350° C. and the gaseous species are tetraethoxy silane (TEOS), oxygen (O$_2$), and helium (He), for example. As shown in FIG. 17, the cavity 101 is thus formed within each buried region 100.

In a similar way to that explained with reference to FIGS. 9 to 11, the semiconductor device 22 is formed in each element arrangement region 200 by a microfabrication process, and the protective film 30 is then formed on the entire surface of the semiconductor wafer 1. Next, in a similar way to that explained with reference to FIG. 12, dicing is performed at the dicing lines 300 using the blades 60 to divide the semiconductor wafer 1 into a plurality of chips for each semiconductor device 22. The semiconductor device 22 shown in FIG. 17 is thus completed as described above.

Figure 18:
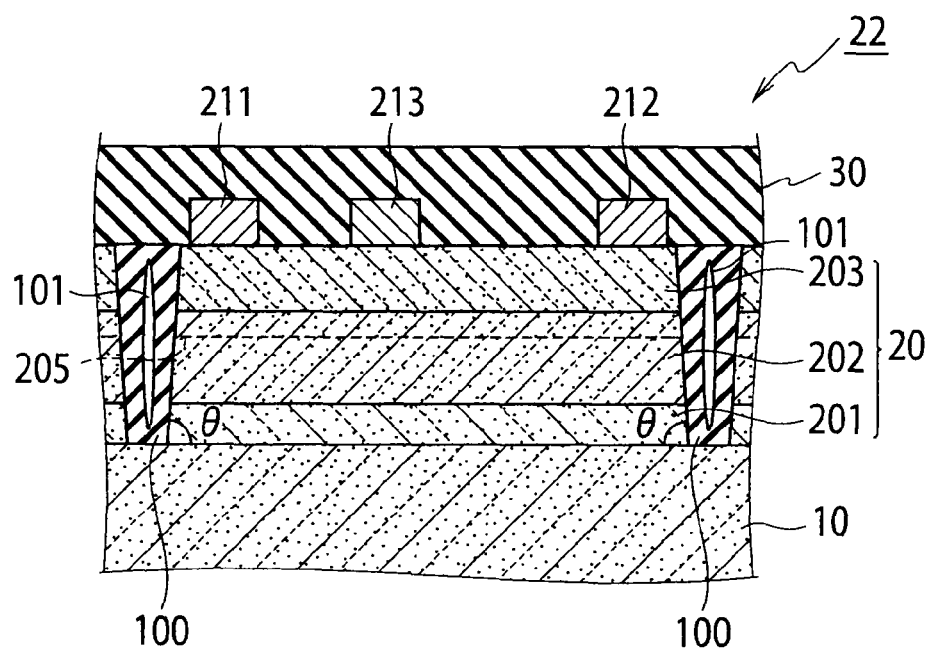
FIG. 18 is a cross-sectional view showing another structure of the semiconductor device according to the third embodiment of the present invention.

As shown in FIG. 18, each buried region 100 including the cavity 101 may be formed in a forward tapered shape. For example, the grooves 110 having a forward tapered shape are formed in a similar way to that of the semiconductor device 22 shown in FIG. 13. The grooves 110 having the forwarded tapered shape are filled with a PE-TEOS film so that void is generated, thus forming the cavity 101 in each forward-tapered buried region 100. As described with reference to FIG. 13, it is therefore possible to prevent the occurrence of leak current at the edge of the semiconductor device 22.

The provision of cavities in the buried regions 100 as described above can further prevent the blades 60 from being damaged. The others are substantially the same as those of the first embodiment, and the redundant description is omitted.

Other Embodiments

In the above description of the embodiments, one HEMT is formed in each element arrangement region 200. However, it is possible to form a plurality of semiconductor devices in each element arrangement region 200.

Various modifications will become possible for those skilled in the art after receiving the teachings of the present disclosure without departing from the scope thereof.

What is claimed is:

1. A method of manufacturing a semiconductor device comprising:
    preparing a semiconductor wafer including a silicon substrate and a laminate having a compound semiconductor layer with a higher hardness than that of the silicon substrate;
    etching and removing a part of the laminate in a thickness direction until the silicon substrate is exposed to form trench regions in a grid, each trench region including a plurality of stripe grooves extending in parallel to each other;
    filling an inside of the grooves with a material having a lower hardness than the compound semiconductor layer to form a buried region, wherein the inside of each of the grooves is filled with the material having the lower hardness than that of the compound semiconductor layer to form a cavity, which is surrounded by the material having the lower hardness than that of the compound semiconductor layer, within each of the buried regions;
    forming semiconductor devices in element arrangement regions of the laminate each surrounded by the trench regions; and
    dividing the semiconductor wafer into a plurality of chips for each semiconductor device by dicing using a blade at a dicing line which is defined within the trench region and includes at least one of the buried regions.

2. The method of claim 1, wherein the grooves are filled to allow upper surfaces of the buried regions to be located in a same plane level as an upper surface of the laminate.

3. The method of claim 1, wherein the sectional shape of each of the grooves along a direction orthogonal to a direction that the groove extends is a tapered shape narrow at the bottom and wide at the top.

4. The method of claim 1, further comprising:
    forming a high resistance region on a side surface and a bottom surface of each of the buried region.

5. The method of claim 1, wherein the material filling the inside of each of the grooves includes at least a high resistance material.

6. The method of claim 1, wherein the dicing line is defined so that at least one of the buried regions exist in each side of the dicing line.

7. The method of claim 1, wherein each of the grooves is filled with a polysilicon film after an insulating film is formed on a side surface and a bottom surface of each of the grooves.

8. The method of claim 1, wherein each of the grooves is filled with any of a metal and a resin after an insulating film is formed on a side surface and a bottom surface of each of the grooves.

9. The method of claim 4, wherein each of the grooves is filled with a polysilicon film.

* * * * *